United States Patent

Cunningham et al.

[11] Patent Number: 5,784,187
[45] Date of Patent: Jul. 21, 1998

[54] WAFER LEVEL INTEGRATION OF AN OPTICAL MODULATOR AND III-V PHOTODETECTOR

[75] Inventors: John E. Cunningham, Lincroft; Joseph E. Ford, Oakhurst; Keith Wayne Goossen, Aberdeen; James A. Walker, Howell, all of N.J.

[73] Assignee: Lucent Technologies Inc., Murray Hill, N.J.

[21] Appl. No.: 685,174

[22] Filed: Jul. 23, 1996

[51] Int. Cl.[6] .................................................. G02F 1/03
[52] U.S. Cl. .................................................. 359/248; 359/291
[58] Field of Search .................................. 359/248, 290, 359/291, 292, 293, 294, 295; 349/25, 26, 27, 28, 29, 30

[56] References Cited

U.S. PATENT DOCUMENTS

| | | | |
|---|---|---|---|
| 4,818,079 | 4/1989 | Maserjian | 350/354 |
| 5,043,773 | 8/1991 | Precht et al. | 357/16 |
| 5,170,269 | 12/1992 | Lin et al. | 359/291 |
| 5,280,184 | 1/1994 | Jokerst et al. | 257/82 |
| 5,453,860 | 9/1995 | Akiyama et al. | 359/72 |
| 5,477,809 | 12/1995 | Kawano | 117/108 |
| 5,485,014 | 1/1996 | Jain et al. | 359/248 |
| 5,519,529 | 5/1996 | Ahearn et al. | 359/248 |
| 5,657,148 | 8/1997 | Feuer et al. | 359/263 |

*Primary Examiner*—Georgia Y. Epps
*Assistant Examiner*—Dawn-Marie Bey

[57] ABSTRACT

A device having an optical modulation region and a photodetection region formed on a single wafer, and methods for making the device, are disclosed. In one configuration, the device consists of an off-axis nonpolar substrate that has, on one side, a region suitable for modulating an optical signal. The other side of the substrate has a region suitable for photodetection. The region suitable for modulating an optical signal includes a movable layer suspended over the substrate. As the movable layer moves under an applied voltage, the reflectivity of the modulation region changes. The photodetection region consists of a plurality of III-V layers. In a second configuration, the device consists of a III-V substrate that has a region for photodetection disposed on one surface. A region for optical modulation is disposed on the photodetection region.

27 Claims, 11 Drawing Sheets

WAFER LEVEL INTEGRATION OF AN OPTICAL MODULATOR AND III-V PHOTODETECTOR

STATEMENT OF RELATED APPLICATIONS

The specification is related to a co-pending application entitled "METHOD AND ARRANGEMENT FOR A COMBINED MODULATOR/PHOTODETECTOR," filed Jul. 5, 1996; Attorney Docket: Bishop 1-45-33; by D. Bishop, K. W.Goossen and J. A. Walker and assigned to the present assignee.

FIELD OF THE INVENTION

The present invention relates to optical modulators and photodetectors. More particularly, the present invention relates to a device capable of providing both an optical modulation function and a photodetection function.

BACKGROUND OF THE INVENTION

Optical communications systems employ various photonic devices, such as photodetectors and optical modulators, for accomplishing a variety of processing tasks. Typically, these devices are separately packaged for integration into the optical communications system.

The photonics package typically includes, in addition to the photonics device, an optical fiber, a container in which the package resides and an electrical header, among other ancillary parts. The cost of such photonics packages is typically controlled, especially at high production volumes, by items other than the photonics device. For example, at high production volumes, the cost of some photodetector packages and optical modulator packages is dominated by the cost of the optical fiber included in such packages.

As such, it would be desirable to package such devices in a way that decreases usage of optical fiber and other ancillary parts.

SUMMARY OF THE INVENTION

Methods and apparatus for a wafer-level-integrated optical modulator and photodetector are disclosed. According to a first embodiment of the present invention, a first plurality of layers of material suitable for providing an optical modulation function are deposited on a first surface of a double-sided, polished, non-polar semiconductor, off-axis wafer. Next, III-V layers suitable for providing a photodetection function are grown on a second surface of the off-axis wafer. After the III-V layers are grown, the first plurality of layers are covered by a protective material, such as photoresist. Once the first plurality of layers is protected, a photodetection region is fabricated from the III-V layers using standard processing techniques. After the photodetection region is formed, it is covered with a protective material. The first plurality of layers are then processed into a region capable of modulating an optical signal. Finally, the protective material covering the photodetection region is removed and wires are bonded to surface contacts at the modulation region and the photodetection region. The device can be mounted to an electrical header and packaged within a suitable container.

In a second embodiment, a photodetection region is formed on the first surface of a wafer formed from a polar semiconductor. A layer that provides electrical insulation is then deposited on the first surface of the wafer and over a portion of the photodetection region. A thin film of conductive material is deposited on the insulating layer, and is in electrical contact with the photodetection region. The thin film provides electrical communication between the photodetection region and off-chip electronics devices. Layers of material suitable for providing an optical modulation function are deposited on the photodetection region, and then patterned into an optical modulator.

BRIEF DESCRIPTION OF THE DRAWINGS

Further features of the invention will become more apparent from the following detailed description of specific embodiments thereof when read in conjunction with the accompanying drawings, in which like elements have like reference numerals and in which:

FIG. 10 is a flow diagram of a method according to the present invention for making the wafer-level-integrated optical modulator and photodetector of FIG.9;

FIG. 12b shows an insulating layer, a photodetection region contact and a thin film wire trace deposited on the photodetection region of FIG.12a;

DETAILED DESCRIPTION OF THE INVENTION

The present invention pertains to a device, formed on a single wafer, capable of providing optical modulation and photodetection. Before describing the device, and methods for making it, some embodiments of optical modulators and photodetectors having structures suitable for use in conjunction with the present invention will be described.

Figure 1:
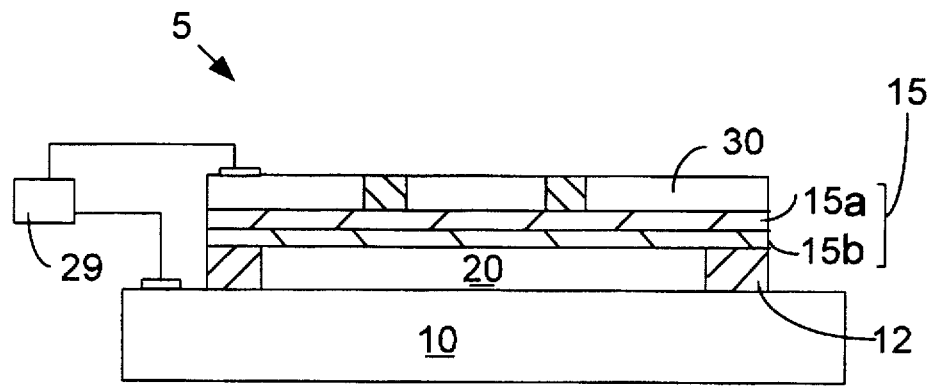
FIG. 1 is a cross-sectional side view, through the line aa in FIG. 2, of an exemplary optical modulator having a structure suitable for use in the present invention.
Figure 2:
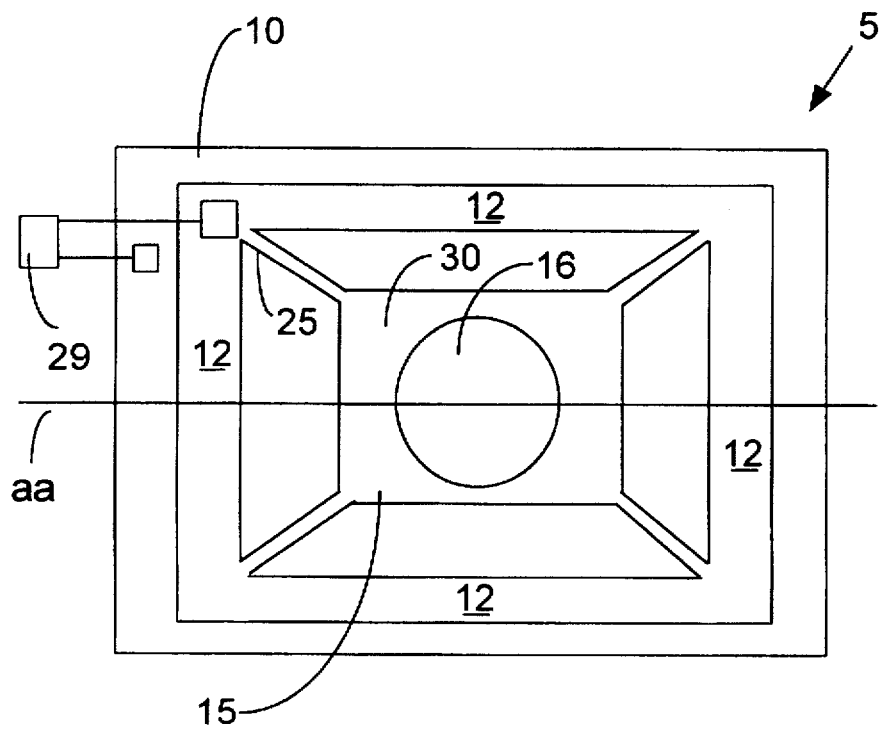
FIG. 2 is a top view of the modulator of FIG. 1.

An embodiment of an optical modulator 5 having a structure suitable for use in conjunction with the present invention is shown in FIGS. 1 and 2. As shown in FIG. 1, which is a cross-sectional view through line aa in FIG. 2, the modulator 5 comprises a substrate 10 and a membrane 15 having one or more layers, such as the layers 15a and an optional layer 15b. The membrane 15 and the substrate 10 are spaced from each other defining a gap 20. As shown in FIG. 2, which is a plan view of the modulator 5, the membrane 15 is suspended over the substrate 10 by support arms 25. The supports arms 25 are in turn supported by a nonconductive support layer 12. In other embodiments, discrete support arms 25 are not present. Rather, the membrane 15 itself overlaps the nonconductive support layer 12.

The membrane 15 and the substrate 10, which are electrically isolated from one another, are electrically connected to a controlled voltage source 29. Applying a voltage across the membrane 15 and substrate 10 generates an electrostatic force that moves the membrane toward the substrate. As the membrane 15 moves, the size of the gap 20 changes, and so does the reflectivity of the modulator 5. The change in reflectivity of the modulator 5 alters the measured amplitude of an optical signal reflected from the modulator. The changing reflectivity of the modulator 5 may thus be used to modulate an optical signal.

In the modulator 5, a large change in reflectivity can be obtained if the following two conditions are met. First, the layer 15a has a thickness that is one-quarter of a wavelength, $\lambda$, of the optical signal being processed ("the operating wavelength"), as measured in the layer. And second, the layer 15a has a refractive index, $n_m$, that is about equal to the square root of the refractive index, $n_s$, of the substrate 10. Given those parameters, the modulator 5 will be highly reflective when the position of the membrane 15 is such that the gap 20 is an odd integer multiple of one-quarter of the operating wavelength, that is, $m\lambda/4$ where m is odd. Conversely, the modulator 5 will exhibit minimal reflectivity when the gap 20 is zero or an even integer multiple of one-quarter of the operating wavelength, that is, $m\lambda/4$ where m is odd or zero.

For maximum modulator contrast, the modulator 5 is fabricated, i.e., the gap 20 is sized, so that in the absence of an applied voltage, the modulator will exhibit its minimum or maximum reflectivity. As described above, this occurs when the gap 20 is an integer multiple of $\lambda/4$. When biased, the membrane 15 preferably moves a distance of $\lambda/4$, so that the gap 20 is still at some multiple of $\lambda/4$. As such, the modulator exhibits either maximum or minimum reflectivity in its biased mode, as well.

It will be appreciated that the membrane 15 and the substrate 10 must be rendered conductive if they are not intrinsically conductive. Conductivity can be imparted to the membrane by disposing a conductive layer 30 on it. If the conductive layer 30 is not optically transparent, then, as shown in FIG. 2, an optical window 16 must be provided through the conductive layer 30. Conductivity can be imparted to the substrate by doping it with suitable materials.

In a preferred embodiment, the layer 15a is silicon nitride and the substrate 10 is silicon. Since the refractive index of silicon nitride is nominally about 2, and the refractive index of silicon is nominally 3.5, the refractive index of the silicon nitride must be specifically tailored, by well known methods, such that $n_{silicon\ nitride} = n_m \approx n_s^{0.5} = (n_{silicon})^{0.5}$. The optional layer 15b serves as a strained layer allowing the mechanical properties of the modulator 5 to be tailored independently of the optical properties. In particular, the overall stress in the membrane can be tailored by adjusting the stress in the layer 15b. In a preferred embodiment, the layer 15b is polysilicon.

The optical modulator 5 can be formed using standard photolithographic processing techniques, as follows. The substrate 10, which may be in the form of a wafer, is preferably doped with phosphorous or boron. A sacrificial layer 12a of erodible material is deposited upon the substrate 10. The erodible material is selected so that a suitable wet etch will erode this material at a much greater rate than any of the other layers that comprise the modulator 5. Suitable erodible materials include, without limitation, phosphosilicate glass (PSG), silicon dioxide and aluminum. The sacrificial layer 12a is deposited to a thickness equivalent to size of the gap 20 when the modulator is quiescent, that is, when no voltage is applied.

The various layers comprising the membrane 15 are then deposited. If the membrane 15 is to include the second, optional strained layer, then the layer 15bb is deposited, preferably to a thickness of $\lambda/4$, on the sacrificial layer 12a. The layer 15aa is then deposited on the layer 15bb, again to a thickness of $\lambda/4$. The layer 15aa is deposited under conditions appropriate for tailoring its refractive index. Such conditions are known to those skilled in the art. The aforementioned layers are then patterned according to well known photolithographic techniques to define the various features of the modulator 5, such as the nonconductive support layer 12, the membrane layers 15a and 15b, and, in some embodiments, support arms 25. If required, a conductive layer 30 can be deposited on the membrane layer 15a.

Further description of exemplary embodiments of micromechanical optical modulators 5 suitable for use in conjunction with preferred embodiments of the present invention, and which operate substantially as described above, include those disclosed in U.S. Pat. No. 5,500,761, and co-pending U.S. patent applications Ser. No. 08/283,106 filed Jul. 29, 1994, Ser. No. 08/578,590 filed Jun. 7, 1995, Ser. No. 08/479,476 filed Jun. 7, 1995, Ser. No. 08/578,123 filed Dec. 26, 1995, Ser. No. 08/565,453 and Ser. No. 08/597,003, all of which are assigned to the present assignee. The aforementioned patent and patent applications, as well as any publications mentioned elsewhere in this specification, are incorporated herein by reference.

It will be apparent from the description of the invention provided later in this specification that modulators having structures other than those described above and in the referenced patent and patent applications are suitable for use in conjunction with the present invention. In some embodiments, the use of such other modulators, for example, semiconductor optical modulators, may require variations of the present invention that are within the capabilities of those skilled in the art. Such embodiments are within the contemplated scope of the present invention.

Figure 3:
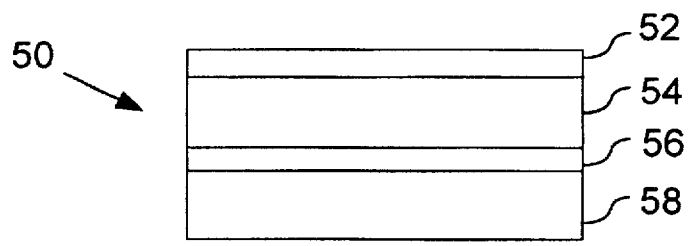
FIG. 3 shows an exemplary photodetector having a structure suitable for use in the present invention.

A wide variety of photodetectors can be used in conjunction with the present invention, including, without limitation, photoconductors, photodiodes, avalanche photodiodes, phototransistors, heterojunction photodiodes, P-I-N multiple quantum well detectors and metal-insulator-III-V photodiodes. An exemplary photodetector is shown in FIG. 3.

The photodetector 50 includes a n$^+$InP substrate layer 52, a n$^+$InP layer 54 disposed on the substrate layer 52, a nominally undoped GaInAs layer 56 disposed on the layer 54 and a p$^+$GaInAs layer 58. It should be understood that photodetectors, including those mentioned above, having a structure other than the exemplary photodetector shown in FIG. 3 can suitably be used in conjunction with the present invention.

The various layers comprising the typical photodetector 50 can be deposited using well known methods such as, for example, molecular beam epitaxy (MBE), metal-organic chemical vapor deposition (MOCVD) and the like.

Figure 4:
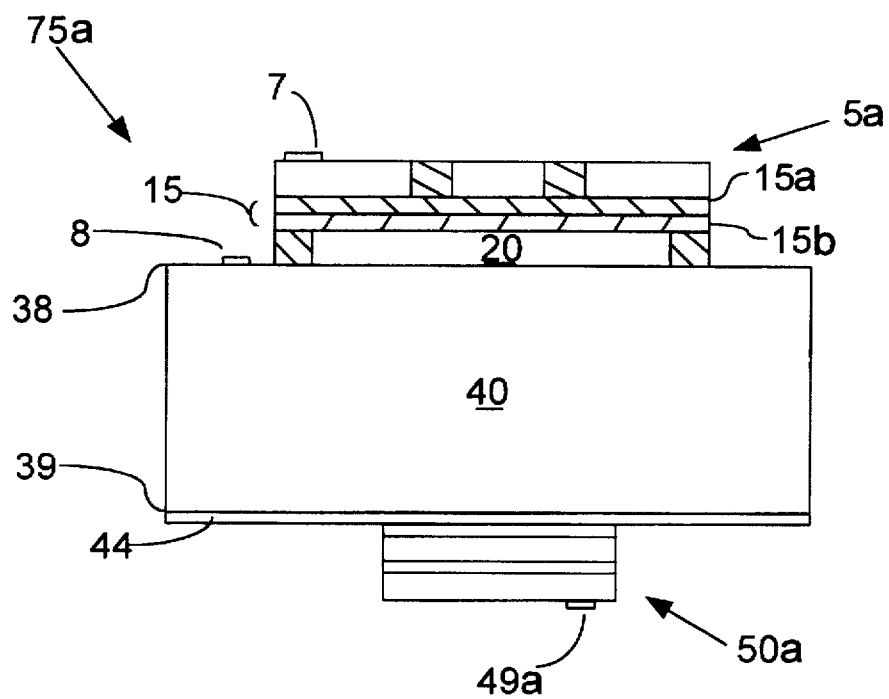
FIG. 4 is a cross-sectional side view of a wafer-level-integrated optical modulator and photodetector according to a first embodiment of the present invention.

According to one aspect of the present invention, a first region capable of providing an optical modulation function, and a second region capable of providing a photodetection function are formed on the same wafer. A first illustrative embodiment of a wafer-level-integrated (WLI) modulator/photodetector 75a is shown in FIG. 4. The WLI modulator/photodetector 75a includes a modulation region 5a and a photodetection region 50a that are formed on opposed surfaces 38 and 39, respectively, of an off-axis silicon substrate or wafer 40. The modulation region includes a membrane 15 supported by a nonconductive support layer 12. A gap 20 is formed between the membrane 15 and the substrate 40. The exemplary modulation region 5a shown in FIG. 4 has a membrane 15 comprised of two layers, 15a and 15b, as described for the optical modulator 5 shown in FIGS. 1 & 2. A first and second wire from a controlled voltage source, not shown, are bonded to bond pads or contacts 7 and 8 to place the controlled voltage source in electrical connection with the membrane 15 and substrate 40, respectively.

In a preferred embodiment, the photodetection region 50a is disposed on a buffer layer 44 situated on the surface 39 of the wafer 40, rather than directly on the surface 39. The buffer layer 44 provides a lattice-mismatch relaxation region between the first III-V layer, typically InP in communications applications, and the off axis substrate 40. The detection region 50a shown in FIG. 4 has four layers. It should be appreciated that in other embodiments, more or less layers may be present depending upon operating basis of the photodetection region. A surface contact 49a on the photodetection region 50a provides electrical contact to the top layer of the photodetection region, which, is typically either a n- or a p-doped layer. The other contact can be provided by the substrate 40.

The off-axis orientation of the silicon substrate 40 significantly reduces problems such as antiphase disorder and lattice mismatch that are associated with growing polar semiconductors, such as the III-V semiconductors used to form the photodetection region 50a, on standard orientation (100) nonpolar substrates, such as silicon. Preferably the off-axis wafer is tilted toward the (110) surface in an amount between about ½° to 5°. As described above, the problem of lattice mismatch is further ameliorated by adding the buffer layer 44. Moreover, the structure of the modulation region is such that the optical operation of the region does not depend on the crystal orientation of the substrate. As such, forming such modulation regions on an off-axis substrate 40 presents no difficulties, either.

A first embodiment of a method for forming the WLI modulator/photodetector 75a is described below and illustrated by flow diagram in FIG. 5. As indicated in operation block 201, the layers used for forming the optical modulation region 5a are deposited on a first side of a double-sided polished off-axis wafer. An off-axis wafer 40 with such layers deposited is shown in FIG. 6. In the embodiment shown in FIG. 6, the nascent modulation region consists of a nonconductive support layer 12a, preferably PSG, a strained layer 15bb, preferably polysilicon, and a layer 15aa, preferably silicon nitride. These layers are deposited using low pressure chemical vapor deposition (LPCVD) or other methods known in the art. Suitable alternative materials for those layers are described in the aforementioned patent and patent applications.

Figure 6:
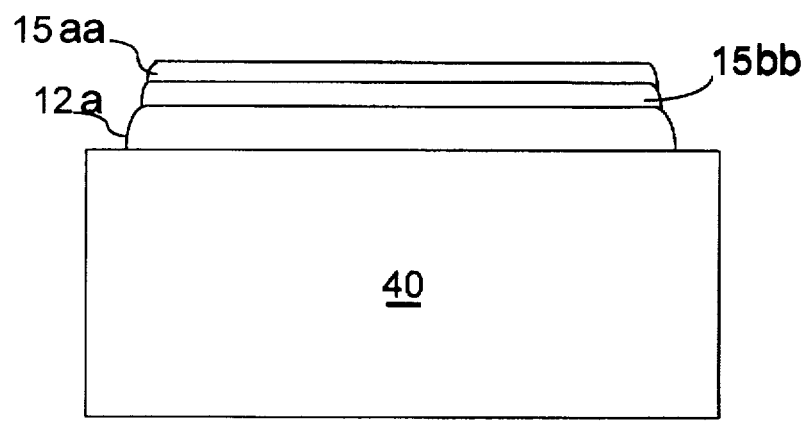
FIG. 6 shows the dielectric films of the nascent optical modulation region deposited on an off-axis silicon wafer.
Figure 7:
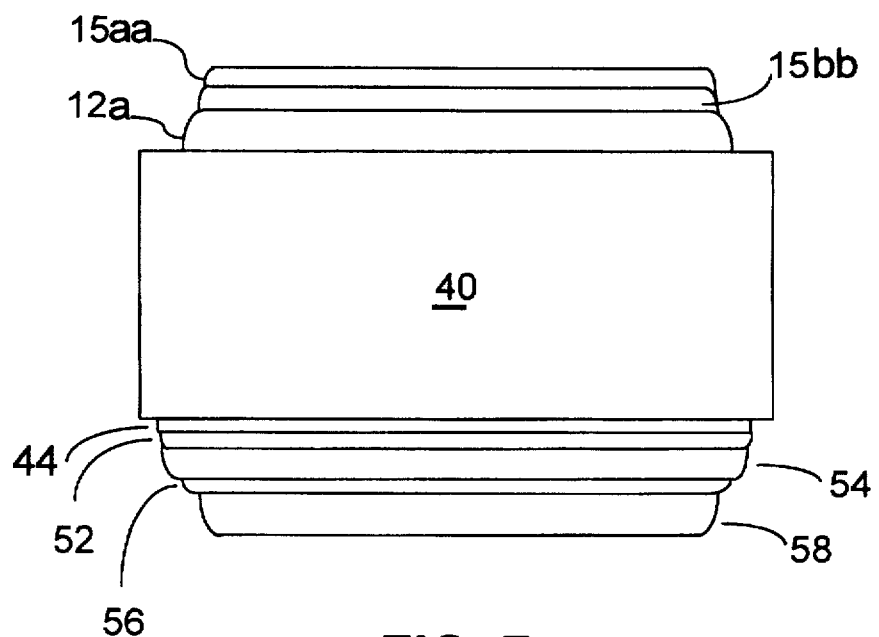
FIG. 7 shows the a buffer layer and the III-V films of the nascent photodetection region deposited on the off-axis silicon wafer of FIG. 6.

After the modulator layers are deposited, the layers comprising the photodetection region 50a are deposited on a second side of the wafer, opposed from the first side. Preferably, a buffer layer 44 is first deposited on the substrate 40, as indicated in operation block 203, to provide strain relief. The buffer layer is preferably InP, but other compound semiconductors may suitably be used. As noted in operation block 205, the layers for the photodetection region 50a are then deposited on the buffer layer 44, preferably using heteroeptaxial MBE. FIG. 7 shows the off-axis wafer 40 of FIG. 6 with the buffer layer 44 and appropriate III-V layers deposited. In the embodiment shown in FIG. 7, the nascent photodetection region consists of a n$^+$InP substrate layer 52a, a n$^+$InP layer 54a disposed on the substrate layer 52a, a nominally undoped GaInAs layer 56a disposed on the layer 54a and a p$^+$GaInAs layer 58a.

In preparation for patterning the photodetector region 50a, the layers comprising the nascent modulation region are protected. In one embodiment, those layers are protected by covering them with a layer 35 of material, as indicated in operation block 207 of FIG. 5. Preferably, the layer 35 is thick-film photoresist, although other materials, such as polyimide, that will be recognized as appropriate by those skilled in the art may suitably be used.

Figure 8:
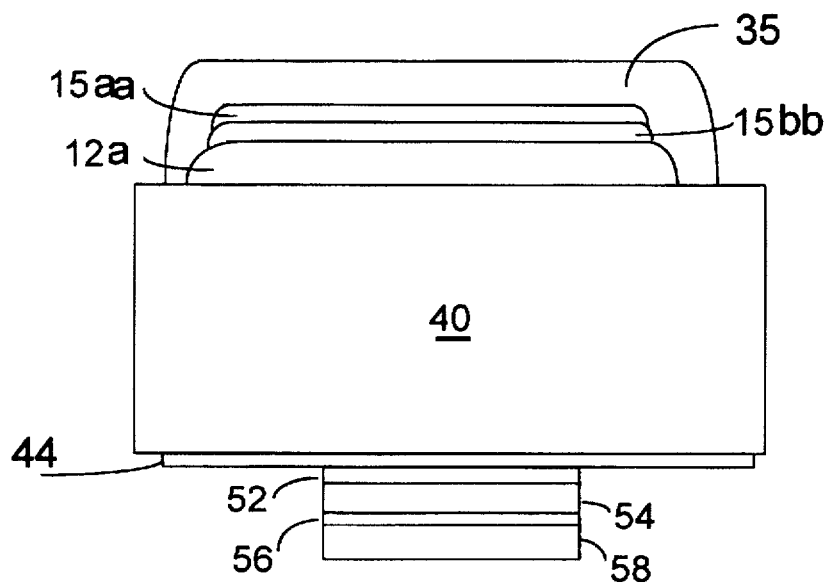
FIG. 8 shows the III-V films of FIG. 7 processed into a photodetection region.

As specified in operation block 209, the photodetection region 50a is next formed. FIG. 8 shows the wafer 40 in this state. The photodetection region 50a is formed using standard processing methods.

Figure 5:
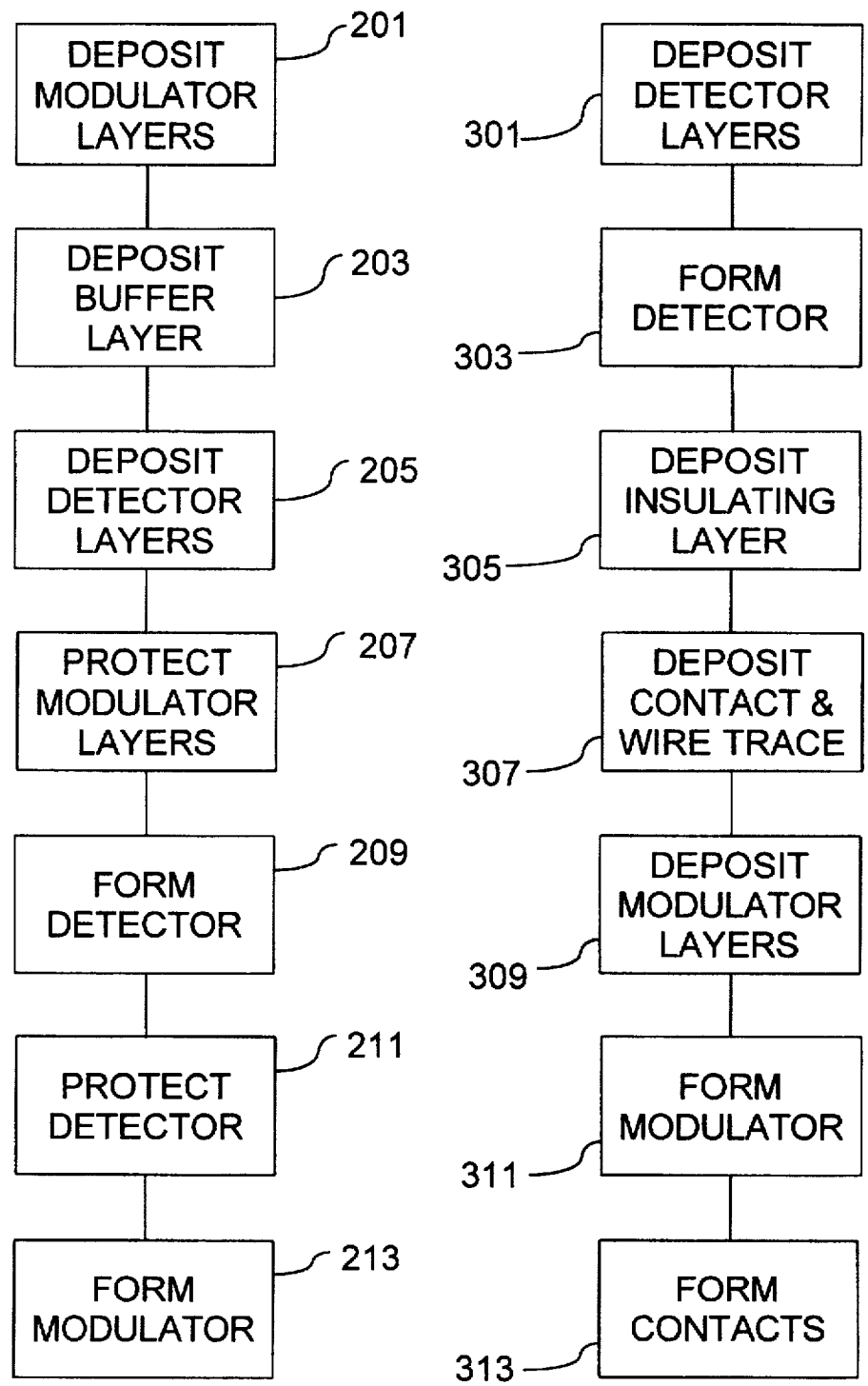
FIG. 5 is a flow diagram of a method according to the present invention for making the wafer-level-integrated optical modulator and photodetector of FIG. 4.

In preparation for patterning the layers comprising the nascent modulation region, a protective layer 60 is deposited over the fully-formed photodetection region, as indicated in operation block 211 of FIG. 5. Like the layer 35, the layer 60 is preferably thick-film photoresist.

The unprotected layers are then patterned into the modulation region 5a using standard photolithographic processing techniques, as per operation block 213 of FIG. 5. Contacts are then patterned as appropriate. The fully formed WLI modulator/photodetector is shown in FIG. 4.

Figure 9:
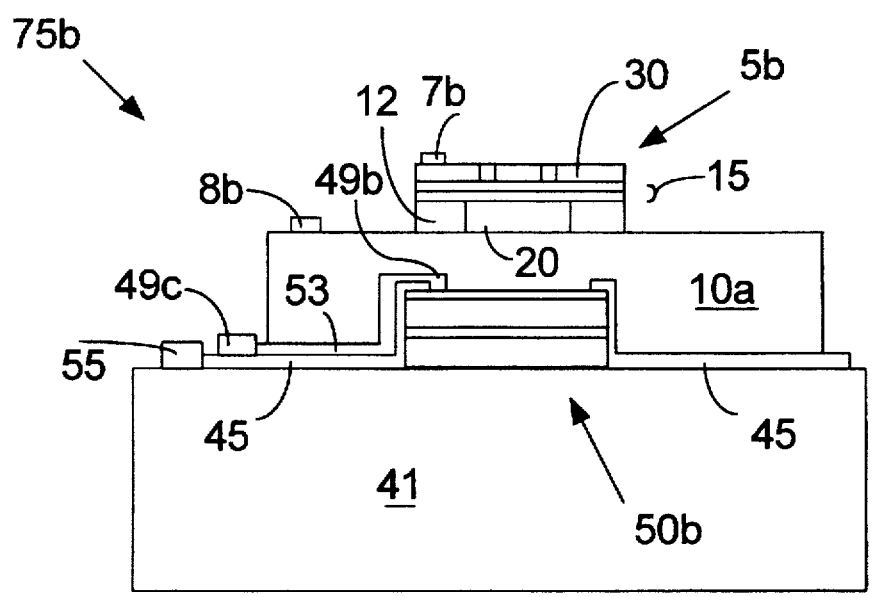
FIG. 9 is a cross-sectional side view of a wafer-level-integrated optical modulator and photodetector according to a second embodiment of the present invention.

A second embodiment of a wafer-level-integrated modulator/photodetector 75b according to the present invention is shown in FIG. 9. In the second embodiment, a modulation region 5b is formed on top of a photodetection region 50b that is formed on a III-V wafer or substrate 41. As shown in FIG. 9, an insulating layer 45, preferably silicon nitride, is disposed over a portion of the substrate 41 and over a portion of the photodetection region 50b. A photodetector contact 49b is disposed on the photodetection region 50b. A thin film wire trace 53 provides electrical connection between the photodetector contact 49b and a contact 8b disposed on the "substrate" portion 10a of the modulation region 5b through an intermediate contact 49c disposed on the insulating layer 45. A contact 55 is disposed on the substrate 41.

The "substrate" 10a of the modulation region 5b is provided by a layer of nonpolar semiconductor that is deposited over the photodetection region 50b, and over the insulating layer 45, which electrically isolates the modulation region substrate 10a from the substrate 41. The modulation region substrate 10a can be polysilicon, single crystal silicon or, preferably amorphous silicon. Preferably, the modulation region substrate 10a is less than about 5 microns in thickness. As in the previous embodiment, the modulator region 5a comprises a membrane 15 having one or more layers supported over the substrate 10a by a nonconductive support 12. A gap 20 is defined between the membrane 15 and the substrate 10a. A contact 7b is in electrical contact with the membrane 15.

The photodetection region 50b is defined, as in the previous embodiment, by several III–V layers. A plurality of different combinations of layers may suitably be used for the photodetection region 50b, as will be appreciated by those skilled in the art. The contacts 49b, 49c, 8b and 55 provide electrical contact between the photodetection region and processing equipment, not shown.

Figure 11:
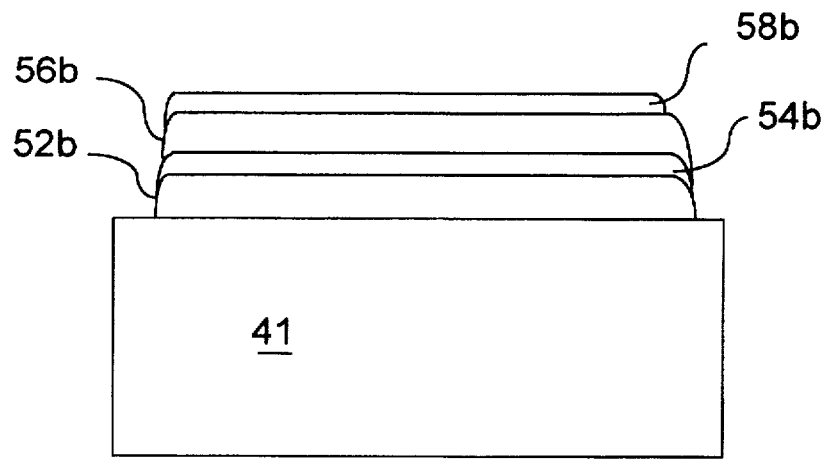
FIG. 11 shows the III-V layers of the nascent photodetection region deposited on a III-V wafer.

An embodiment of a method for forming the WLI modulator/photodetector 75b is illustrated in FIG. 10. As indicated in step 301, the III–V layers for forming the photodetection region 50b are deposited on the III–V wafer 41. The wafer 41 with photodetectors layers 52b–58b deposited thereon is shown in FIG. 11. In FIG. 11, the exemplary photodetection region 50b includes a n⁺InP substrate layer 52b, a n⁺InP layer 54b disposed on the substrate layer 52b, a nominally undoped GaInAs layer 56b disposed on the layer 54b and a p⁺GaInAs layer 58b.

Figure 12A:
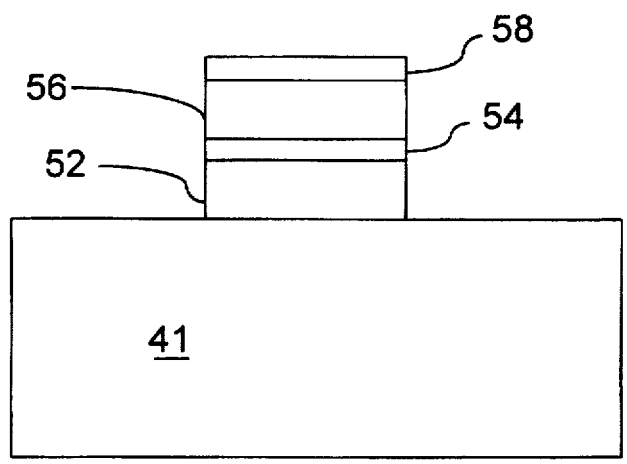
FIG. 12a shows the III-V layers of FIG. 11 patterned into a photodetection region.

After depositing the layers 52b–58b, they are processed using standard techniques into the photodetection region 50b, as indicated in operation block 303 of FIG. 10. The processed photodetection region 50b is shown in FIG. 12a.

Figure 12B:
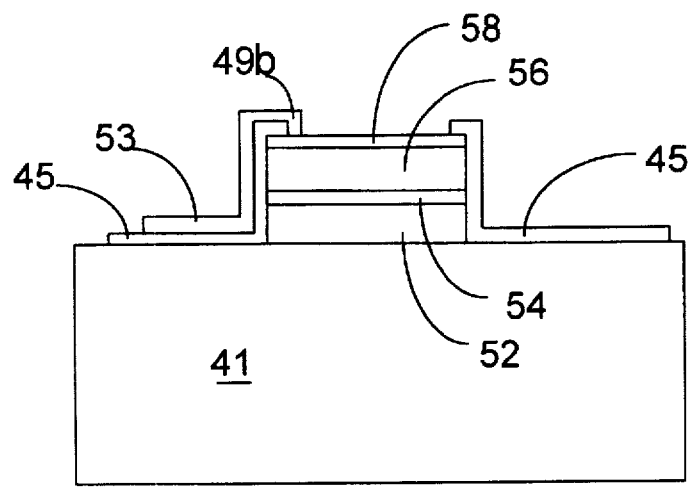

As indicated in operation block 305, the insulating layer 45 is deposited on the III–V substrate over an area sufficient to ensure that when the modulation region substrate 10a is subsequently deposited, the modulation region substrate is electrically isolated from the III–V substrate. In operation block 307, material for forming the contact 49b is deposited on the uppermost layer layer 58b of the photodetection region 50b and overlapping the insulating layer 45. Also, the thin film wire trace 53 is deposited on the insulating layer 45 extending from, and in contact with, the contact 49b. The thin film 53 is deposited so that it extends beyond the region in which the modulation region substrate 10a will be deposited. Thus, electrical communication between the contact 49b and the subsequently deposited contact 49c can be established. The wafer with the insulating layer 45, contact 49b and thin film wire trace 53 is shown in FIG. 12b.

Figure 13:
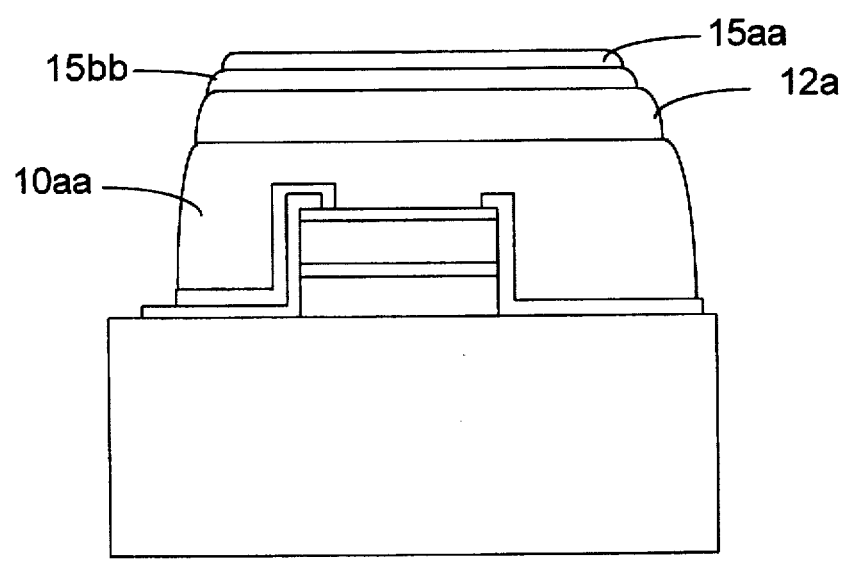
FIG. 13 shows the layers of a nascent optical modulation region deposited on the photodetection region of FIG. 12b.

The layers that will form the modulation region 5b are then deposited, as indicated in operation block 309. The wafer 41 with modulation region layers deposited thereon is shown in FIG. 13. The layer forming the "substrate" 10a of the modulation region is first deposited on the uppermost layer 58b of the photodetection region 50b and on the insulating layer 45. Other layers, such as the layer 12a for forming the nonconductive support and membrane layers 15bb, 15aa are next deposited.

In operation block 311, the layers 10aa, 12a and 15bb and 15aa are patterned into the modulation region 5b. Finally, as indicated in operation block 313, a conductive layer 30a, if required, is deposited on the membrane layer 15a, and the contacts 55, 49c, 7b and 8b are deposited. The fully-formed WLI modulator/photodetector 75b is shown in FIG. 9.

Figure 14:
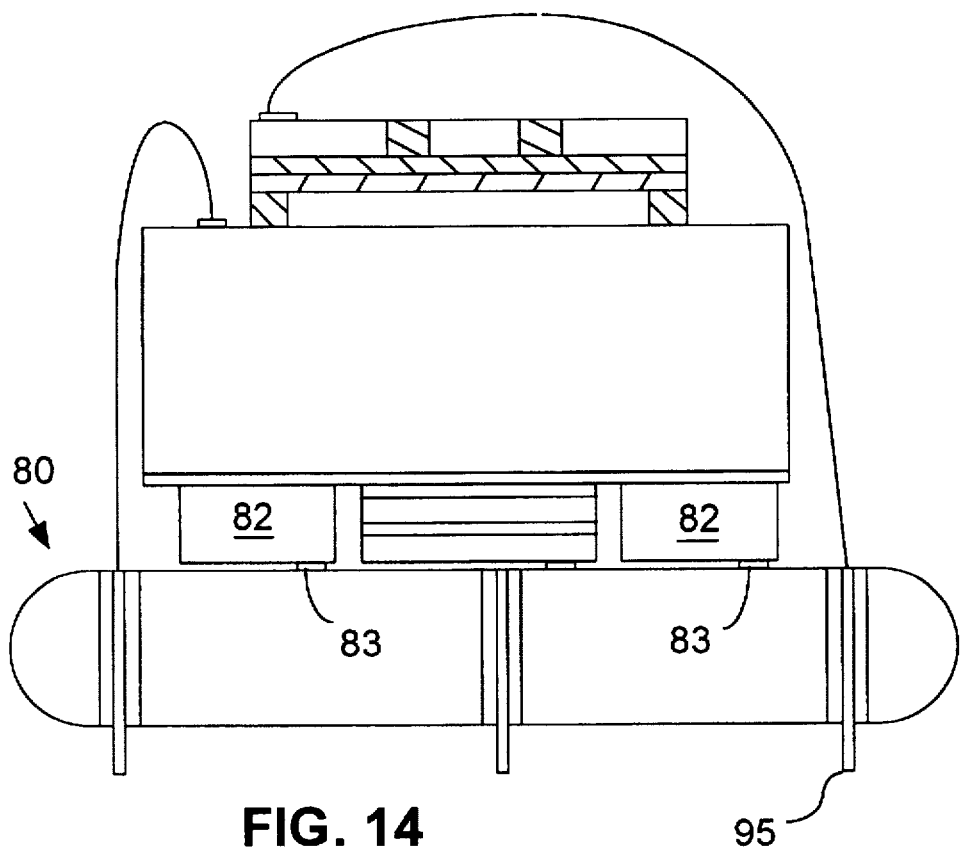
FIG. 14 shows a wafer-level-integrated modulator/photodetector according to the present invention mounted on an electrical header.

In a further embodiment, a WLI modulator/photodetector 75 according to the present invention can be mounted on an electrical header. FIG. 14 shows the illustrative WLI modulator/photodetector 75a mounted on an electrical header 80. The electrical header 80 facilitates electrical connection between the modulation region and processing electronics, and between the photodetection region and processing electronics. Pedestals 82 shown flanking the photodetection region 50a are provided for mechanical stability. The pedestals 82, as well as the photodetection region 50a can be epoxied to the header. Alternatively, the pedestals and the photodetection region can be soldered to the electrical header 80, such as by the solder bumps 83. The photodetector contact 49a may be solder, providing both an attachment function and an electrical conduction function.

In a preferred embodiment, a WLI modulator/photodetector 75 is first attached to an electrically compatible carrier chip by flip chip bonding or other suitable methods known to those skilled in the art. Preferably, the carrier chip is silicon. Contacts on the WLI modulator/photodetector 75 are attached to corresponding contacts on the carrier chip. The carrier chip, with the WLI modulator/photodetector 75 attached, is then attached to the electrical header 80. Electrical connection, via wires or the like, is then established between the electrical header and the carrier chip. The preferred embodiment is especially advantageous when the WLI modulator/photodetector 75 incorporates a III–V wafer. Since such III–V substrates tend to be fragile, applying pressure to the carrier chip when bonding it to the electrical header 80, rather than the III–V substrate, reduces wafer breakage and improves overall device yield.

Figure 15:
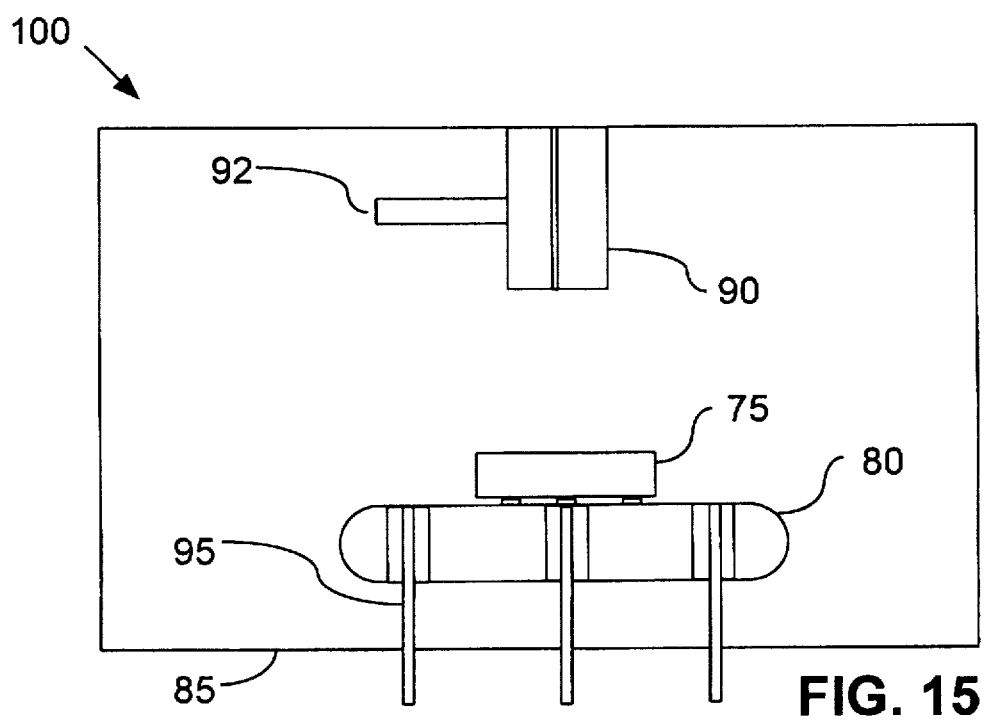
FIG. 15 shows the mounted modulator/photodetector of FIG. 14 packaged with an optical fiber.

In an alternate embodiment, the WLI modulator/photodetector can be "packaged" for incorporation into an optical communication system. Such a package 100 is illustrated in FIG. 15. The package 100 includes a container 85, a WLI modulator/photodetector 75 mounted on an electrical header, such as the header 80, and, optionally, an optical fiber 90.

The container 85 can be made of metal or plastic. A post 92 is typically provided within the container for aligning and attaching the optional optical fiber 90. Electrical leads or pins 95 from the electrical header 80 extend through the container 85 to facilitate electrical connection between the in-package WLI modulator/photodetector 75 and out of package processing devices. Methods for attaching a chip, such as the WLI modulator/photodetector, to an electrical header, and packaging the mounted chip and an optical fiber within a container, are well known to those skilled in the art.

It should be understood that either of the previously described illustrative embodiments of a modulator/photodetector according to the present invention, i.e., 75a or 75b, can suitably be attached to an electrical header 80 and, further, incorporated in the package 100.

Figure 16:
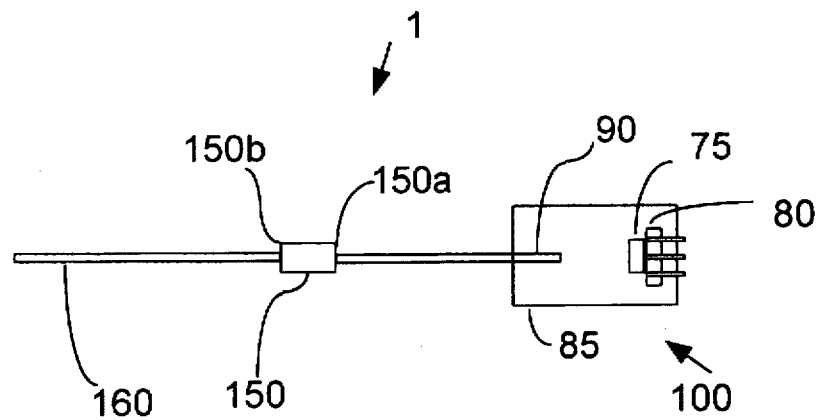
FIG. 16 shows a packaged WLI modulator/photodetector integrated into an optical communications system.

A packaged WLI modulator/photodetector is readily integrated into an optical communications system. A portion I of such an optical communications system is shown in FIG. 16. As shown in FIG. 16, an optional optical fiber 90 from the WLI modulator/ photodetector package 100 is attached to a first end 150a of an optical connector 150. An optical fiber 160 is attached to a second end 150b of the optical connector 150.

Figure 17:
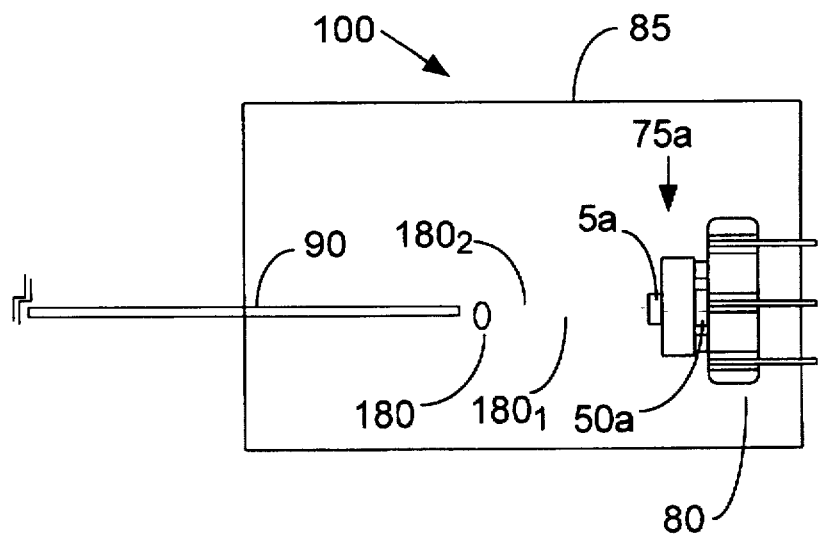
FIG. 17 illustrates the processing of an optical signal using the package WLI modulator/photodetector of FIG. 16.

In operation, an optical signal 180 is delivered to the modulation region of a WLI modulator/photodetector, as shown in FIG. 17. As is well known in the art, information carried by the incoming optical signal 180 can be organized into "packets." The incoming optical signal 180 thus comprises an information containing packet or portion, and a continuous wave (CW) portion. Typically, the CW portion of the incoming optical 180 does not contain information.

A first portion $180_1$ of the power of the incoming optical signal 180 is delivered to the photodetection region 50a by placing the optical modulation region 5a in an at least partially transmissive state or mode. As such, the first portion $180_1$ passes through the optical modulation region and is received by the photodetection region. The relative amounts of power directed to the optical modulation region 5a and the photodetection region 50a are typically set by the requirements of the optical communications system.

The photodetection region and a first group of control/ processing devices, not shown, process the information contained in the received first portion $180_1$ of the optical signal. A second group of control/processing devices, not shown, which includes a controlled voltage source, directs the optical modulation region of the WLI modulator/ photodetector 75a to encode information on the CW portion of the second portion $180_2$ of the optical signal. In a preferred embodiment, such information encoding is accomplished by switching the state of the modulator region between a highly reflective state and a substantially non-reflective (transmissive) state.

It should be understood that in preferred embodiments in which an incoming optical signal is received by the optical modulation region 5a before the photodetection region 50a, the optical modulation region must have at least one state in which it is substantially transparent or transmissive to the incoming optical signal. In such a transmissive state, the incoming optical signal, such as the incoming optical signal $180_1$, passes through the optical modulation region and is received by the photodetection region.

Inclusion of the exemplary WLI modulator/photodetector 75a in the illustrative optical communications system 1 described above is for purposes of illustration, not limitation. It should be understood that in other embodiments, other WLI modulator/photodetectors according to the present invention, such as the exemplary WLI modulator/ photodetector 75b, can be used.

The structure of a WLI modulator/photodetector according to the present invention allows for optimization of the modulation function on a continuing basis. As described above, the reflectivity of an optical modulator, such as the optical modulator 5, is a function of the position of the membrane. Optimum modulator operation, that is, maximum contrast, is achieved when the membrane moves between the relative minima and relative maxima reflectivity positions, as dictated by the control electronics. It will be appreciated that the amount of movement or deflection of the membrane is a function of the magnitude of the voltage applied across the membrane 15 and the substrate 10. It should also be understood that due to modulator to modulator variation, such as the tension in the movable layer 15, the voltage requirement for a particular deflection will vary from modulator to modulator. Furthermore, as a modulator ages, the voltage requirements will vary.

Figure 18:
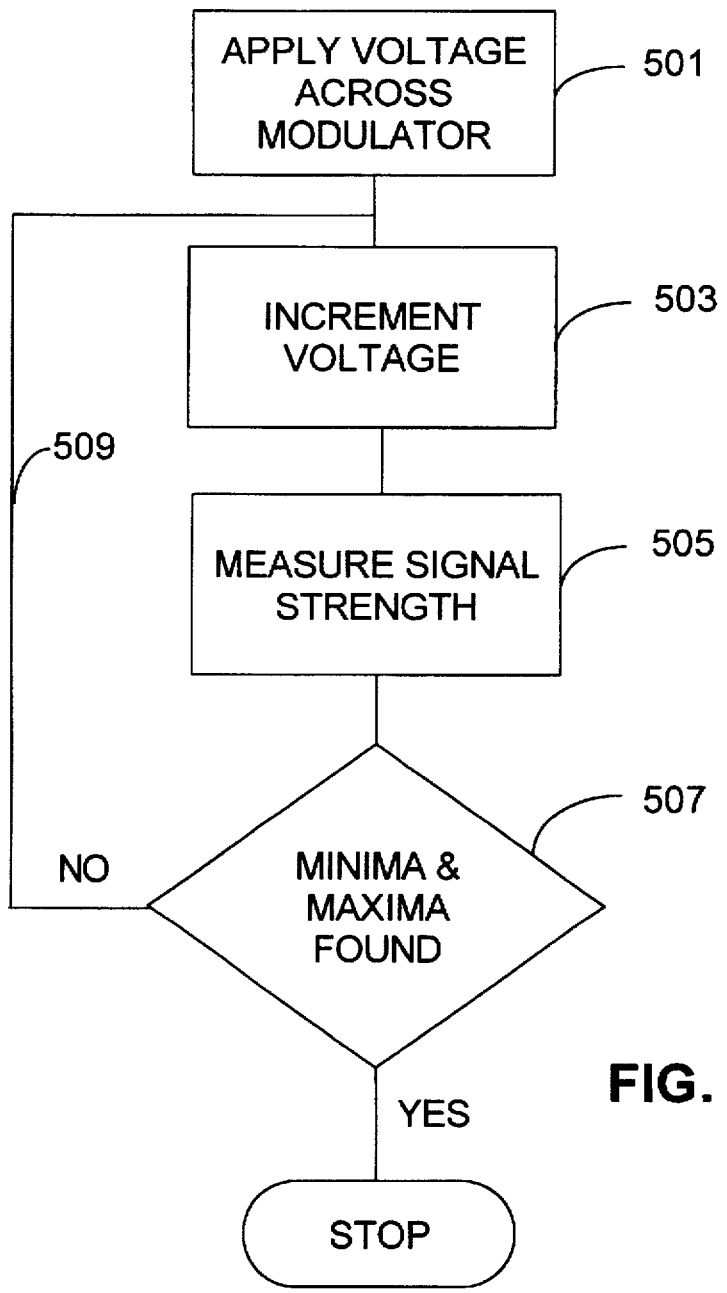
FIG. 18 illustrates a method for optimizing performance of the optical modulation region of the WLI modulator/photodetector.

By measuring the strength of the optical signal received at the photodetection region 50a or 50b, for different voltages applied to the modulation region 5a or 5b, optimum operating voltages can be determined. Specifically, a maximum signal strength at the photodetection region corresponds to a minimum reflectivity for the modulation region. Conversely, a minimum signal strength at the photodetection region corresponds to a maximum reflectivity for the modulation region. Moreover, to account for aging effects, such an optimization procedure can be repeated at periodic intervals. An exemplary method for determining the optimum operating voltage for the modulation region is illustrated in FIG. 18.

According to the exemplary method, an optical signal is placed in optical communication with the optical modulation region 5a, 5b of an WLI modulator/photodetector. As indicated in operation block 401, a voltage is applied across to he modulation region and the signal strength is measured at the photodetection region 50a, 50b. After incrementing the voltage, as noted in operation block 503, the signal strength at the photodetection region is again measured, per operation block 505. Decision block 507 queries whether a maxima and a minima signal strength have been measured. If not, processing returns to operation block 503 via loop back 509. If a maxima and a minima have been determined, then no further measurements need be taken.

The WLI modulator/photodetector is well suited to optimizing the modulation function since the optical path between the modulation region and the photodetection region is quite small so that minimum signal attenuation will occur.

Although a number of specific embodiments of this invention have been shown and described herein, it is to be understood that such embodiments are merely illustrative of the many possible specific arrangements that can be devised in application of the principles of the invention. Numerous and varied other arrangements can be devised in accordance with these principles by those of ordinary skill in the art without departing from the scope and spirit of the invention. Several such variations of the foregoing specific embodiments are described below.

Figure 19:
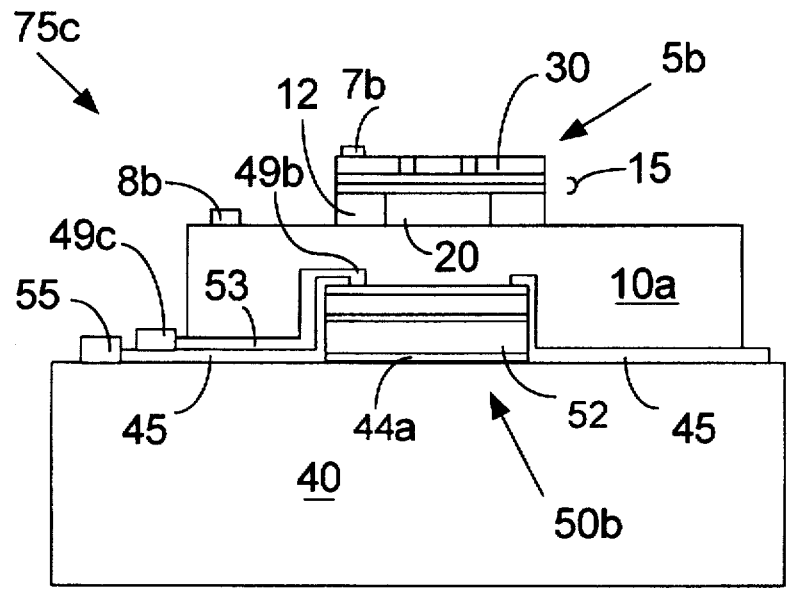
FIG. 19 is a cross-sectional side view of a wafer-level-integrated optical modulator and photodetector according to a third embodiment of the present invention.

In a first variation, the polar substrate 41 of the illustrative embodiment shown in FIG. 9 can be replaced by an off-axis non-polar substrate 40, such as, for example, silicon. A WLI modulator/photodetector 75c incorporating an off-axis non-polar substrate is shown in FIG. 19. The structure of the WLI modulator/photodetector 75c is similar to that of the WLI modulator/photodetector 75b pictured in FIG. 9, except for the aforementioned difference in the substrates as well as the inclusion, in preferred embodiments, of a buffer layer 44a between the substrate 40 and the first photodetector layer 52. As in the WLI modulator/photodetector 75a shown in FIG. 4, the optional buffer layer provides a lattice-mismatch relaxation region between the off-axis substrate 40 and the first III–V layer.

Those skilled in the art will recognize that the refractive indices of III–V compounds typically used in photodetectors have a refractive index similar to that of silicon, the preferred substrate for preferred micromechanical modulators, such as those described earlier in this specification. Thus, in a second variation, the photodetection region 50b can serve as the "substrate" for the modulation region 5b. As such, in a further embodiment of a WLI modulator/photodetector 75d according to the present invention, the non-polar substrate layer 10a can be omitted from the illustrative embodiments of a WLI modulator/photodetector 75b and 75c.

Figure 20:
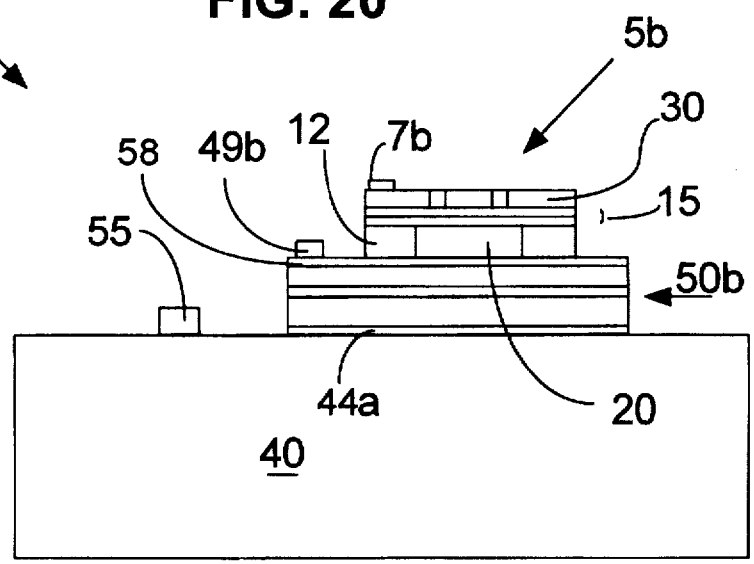
FIG. 20 is a cross-sectional side view of a wafer-level-integrated optical modulator and photodetector according to a fourth embodiment of of the present invention.

A WLI modulator/photodetector 75d having both the modulator region 5b and photodetection 50b disposed on the same side of the wafer 40 or 41, as in the devices 75c and 75b, respectively, but not including a non-polar substrate substrate layer 10a, is shown in FIG. 20. As shown in FIG. 20, the support layer 12 is disposed directly on the uppermost layer 58 of the photodetection region 50b. If the wafer is non-polar, such as the wafer 40, then a buffer layer 44a is preferably disposed between the wafer and the first photodetector layer, as in the device 75c. The WLI modulator/ photodetector 75d can be implemented with only three contacts 7b, 49b and 55, as shown in FIG. 20. The contact 49b is shared contact, functioning as the "substrate" contact for the modulation region 5b, and the photodetector contact for the photodetection region 50b.

The specific embodiments of a WLI photodetector/modulator described herein are directed toward optical communications applications. It should be understood, however, that other embodiments of a WLI modulator/photodetector according to the present invention can be used for other optical applications operating at other optical wavelengths. In such other embodiments, the photodetector may be comprised of different materials. In particular, III–V semiconductors other than InP, such as gallium arsenide (GaAs), may suitably be used. It is within the capabilities of those skilled in the art to appropriately select photodetector composition for a given optics application. Note that the buffer layer utilized for strain relief may be different for such different applications. For example, if the photodetector is GaAs based, then the buffer layer is preferably GaAs.

We claim:

1. A device for converting an optical signal into an electrical signal and for modulating the optical signal, comprising:

an off-axis nonpolar substrate having a first and a second surface;

an optical modulation region formed on the first surface of the substrate, wherein the optical modulation region, in conjunction with the substrate and an applied voltage, is operable to modulate the optical signal based upon movement of a movable member; and a photodetection region formed on the second surface of the substrate, the photodetection region comprising a plurality of III–V semiconductor layers, which layers, in conjunction with the substrate, are operable to convert the optical signal into an electrical signal.

2. The device of claim 1, wherein the substrate is silicon.

3. The device of claim 1, wherein the substrate is characterized by a first refractive index and wherein the movable member is a movable membrane having an optically transparent portion and comprising at least a first layer of material having a second refractive index that is approximately equal to the square root of the first refractive index of the substrate; and, wherein, in a first position the membrane is supported in spaced and superposed relation to the substrate defining a gap.

4. The device of claim 1, and further wherein the photodetection region is disposed on a buffer layer for reducing lattice mismatch, the buffer layer disposed on the second surface of the off-axis nonpolar substrate.

5. The device of claim 1, wherein the plurality comprises at least one layer selected from the group consisting of indium phosphide and gallium arsenide.

6. The device of claim 1, further comprising an electrical header attached to the photodetector region.

7. The device of claim 6 further comprising a container, wherein the electrical header and the attached device are retained within the container.

8. The device of claim 7 further comprising means for receiving an optical signal, which means is in optical communication with the optical modulation region.

9. The device of claim 8 wherein the means is an optical fiber.

10. A device for converting a first portion of an optical signal into an electrical signal and for modulating a second portion of the optical signal, comprising:

a wafer having a first and a second surface, a photodetection region formed on the first surface of the wafer, the photodetection region comprising a plurality of III–V semiconductor layers, which layers, in conjunction with the wafer, are operable to convert the first portion optical signal into an electrical signal;

an optical modulation region formed on the photodetection region, wherein the optical modulation region, in conjunction with an applied voltage, is operable to modulate the second portion of the optical signal based upon movement of a movable member.

11. The device of claim 10, wherein the wafer is a group III–V compound semiconductor.

12. The device of claim 11, wherein the first substrate is selected from the group consisting of indium phosphide and gallium arsenide.

13. The device of claim 10, wherein the plurality of III–V layers comprises at least one layer selected from the group consisting of indium phosphide and gallium arsenide.

14. The device of claim 10, wherein the photodetection region is characterized by a first refractive index, and wherein the movable member is a movable membrane having an optically transparent portion and comprising at least a first layer of material having a second refractive index that is approximately equal to the square root of the first refractive index of the photodetection region; and, wherein, in a first position, the membrane is supported in spaced and superposed relation to the photodetection region defining a gap.

15. The device of claim 12, wherein the optical modulation region comprises:

a layer comprised of a non-polar material characterized by a first refractive index;

the movable member, which comprises a movable membrane having an optically transparent portion and comprising at least a first layer of material having a second refractive index that is approximately equal to the square root of the first refractive index of the non-polar material; and a support for positioning the membrane in a spaced and superposed relation to the layer comprising the non-polar material defining a gap.

16. The device of claim 15, wherein the nonpolar material is silicon .

17. The device of claim 15, further comprising: an insulating layer disposed on a portion of the photodetection region and on a portion of the first surface of the III–V substrate, wherein the insulating layer electrically isolates the modulation region from the III–V substrate, and a thin conductive film disposed on a portion of the insulating layer extending from, and in contact with, a first contact disposed on the photodetection region and extending to, and in contact with, a second contact disposed on a second portion of the electrically insulating layer.

18. The device of claim 10 wherein the wafer comprises a non-polar semiconductor.

19. The device of claim 8 wherein the wafer is silicon.

20. The device of claim 18, and further wherein the photodetection region is disposed on a buffer layer for reducing lattice mismatch, the buffer layer disposed on the first surface of the wafer.

21. The device of claim 10, further comprising an electrical header attached to the second surface of the wafer.

22. The device of claim 10, further comprising:

a carrier having a first and a second surface, wherein the first surface of the carrier is attached to the second surface of the wafer; and an electrical header attached to the second surface of the carrier.

23. The device of claim 21 further comprising a container, wherein the electrical header, the wafer, the optical modulation region and the photodetection region are retained within the container.

24. The device of claim 22 further comprising a container, wherein the electrical header, the carrier, wafer, the optical modulation region and the photodetection region are retained within the container.

25. The device of claim 23 further comprising means for receiving an optical signal, which means is in optical communication with the optical modulation region.

26. The device of claim 25 wherein the means is an optical fiber.

27. An optical communications system comprising: an optical fiber for carrying a first optical communications signal; an optical fiber connector that is connected, at a first end, to the optical fiber; a packaged WLI modulator/ photodetector, comprising:

a WLI modulator/photodetector having, integrated on a single wafer, a mechanically-acting optical modulation region comprising a non-polar semiconductor, the optical modulation region operable to modulate a portion of the first optical communications signal, and a photodetection region comprising a polar compound semiconductor, the photodetection region operable to convert a portion of the first optical communications signal into an electrical signal;

an electrical header for electrically connecting the optical modulation region and the photodetection region to processing electronics;

a container for retaining the electrical header and the WLI modulator/photodetector; and a waveguide in optical communication with a second end of the optical fiber connector and the optical modulator region; and processing electronics connected to the electrical header, the processing electronics operable to process the electrical signal from the photodetection region and to control the optical modulation region.

* * * * *